(12) United States Patent
Farnsworth et al.

(10) Patent No.: US 8,947,634 B2
(45) Date of Patent: Feb. 3, 2015

(54) APPARATUS FOR SUPPORTING AN OPTICAL ELEMENT, AND METHOD OF MAKING SAME

(75) Inventors: Windy Lynn Farnsworth, New Milford, CT (US); Sohrab Simani, Waltham, MA (US)

(73) Assignee: ASML Holding N.V., Veldhoven (NL)

( * ) Notice: Subject to any disclaimer, the term of this patent is extended or adjusted under 35 U.S.C. 154(b) by 770 days.

(21) Appl. No.: 12/933,506

(22) PCT Filed: Apr. 15, 2009

(86) PCT No.: PCT/EP2009/002749
§ 371 (c)(1),
(2), (4) Date: Dec. 20, 2010

(87) PCT Pub. No.: WO2009/127400
PCT Pub. Date: Oct. 22, 2009

(65) Prior Publication Data
US 2011/0109891 A1     May 12, 2011

Related U.S. Application Data

(60) Provisional application No. 61/045,207, filed on Apr. 15, 2008.

(51) Int. Cl.
*G03F 7/20* (2006.01)
(52) U.S. Cl.
CPC ................................. *G03F 7/70825* (2013.01)
USPC ........................................... 355/67; 359/819
(58) Field of Classification Search
CPC .................................................. G03F 7/70825
USPC ........................................... 355/67; 359/819
See application file for complete search history.

(56) References Cited

U.S. PATENT DOCUMENTS

| | | | |
|---|---|---|---|
| 5,428,482 A | 6/1995 | Bruning et al. | |
| 6,392,825 B1 | 5/2002 | Trunz et al. | |

(Continued)

FOREIGN PATENT DOCUMENTS

| | | |
|---|---|---|
| EP | 1 026 532 A1 | 8/2000 |
| EP | 1 720 068 A1 | 11/2006 |

(Continued)

OTHER PUBLICATIONS

International Preliminary Report on Patentability and Written Opinion of the International Searching Authority directed to related International Patent Application No. PCT/EP2009/002749, issued Oct. 19, 2010; 6 pages.

(Continued)

*Primary Examiner* — Peter B Kim
*Assistant Examiner* — Michelle Iacoletti
(74) *Attorney, Agent, or Firm* — Sterne, Kessler, Goldstein & Fox P.L.L.C.

(57) ABSTRACT

An apparatus for supporting an optical element is provided. The apparatus includes a lens cell (1003) and a plurality of fingers (1000) coupled to the lens cell. Each finger includes a base (1012) configured to be coupled to the optical element when mounted therein, first (1006*a*) and second (1006*b*) flexures coupled at first respective ends to and extending from the base (1012) at a divergence angle between about 75 and 165 degrees, and a mounting member (1008) configured to couple together second respective ends of the first and second flexures. The mounting member thereby couples the base (1012) to the lens cell (1003).

20 Claims, 15 Drawing Sheets

(56) References Cited

U.S. PATENT DOCUMENTS

| | | | |
|---|---|---|---|
| 6,570,721 B2 | 5/2003 | Wayne et al. | |
| 6,674,585 B1 | 1/2004 | Calvet et al. | |
| 6,757,051 B2 | 6/2004 | Takahashi et al. | |
| 7,006,308 B2 | 2/2006 | Sudoh | |
| 7,123,340 B2 | 10/2006 | Noehte et al. | |
| 7,436,484 B2 | 10/2008 | Van Der Wijst et al. | |
| 7,448,763 B2 | 11/2008 | Frommeyer et al. | |
| 2003/0147603 A1* | 8/2003 | Moran | 385/94 |
| 2006/0198026 A1* | 9/2006 | Fukuyama et al. | 359/611 |
| 2007/0188727 A1* | 8/2007 | Shimizu et al. | 355/55 |
| 2007/0206297 A1* | 9/2007 | Weber et al. | 359/819 |
| 2007/0279768 A1* | 12/2007 | Shibazaki | 359/811 |
| 2008/0204674 A1* | 8/2008 | Imoto | 353/100 |
| 2008/0218721 A1* | 9/2008 | Schoeppach et al. | 355/67 |

FOREIGN PATENT DOCUMENTS

| | | |
|---|---|---|
| JP | 02-195525 A | 8/1990 |
| JP | 2000-227533 A | 8/2000 |
| JP | 2001-124968 A | 5/2001 |
| JP | 2002-083766 A | 3/2002 |
| JP | 2003-090944 A | 3/2003 |
| JP | 2004-531844 A | 10/2004 |
| JP | 2004-347814 A | 12/2004 |
| JP | 2006-066836 A | 3/2006 |
| JP | 2006-191062 A | 7/2006 |
| JP | 2006-349946 A | 12/2006 |
| JP | 2007-002230 A | 1/2007 |
| JP | 2007-189802 A | 7/2007 |
| JP | 2007-304239 A | 11/2007 |
| WO | WO 2005/116773 A1 | 12/2005 |
| WO | WO 2006/000352 A1 | 1/2006 |
| WO | WO 2006/119970 A2 | 11/2006 |

OTHER PUBLICATIONS

English-Language Abstract for Japanese Patent Publication No. 2001-124968 A, published May 11, 2001; 1 page.

English-Language Abstract for Japanese Patent Publication No. 2006-066836 A, published Mar. 9, 2006; 1 page.

English-Language Abstract for Japanese Patent Publication No. 2006-349946 A, published Dec. 28, 2006; 1 page.

International Search Report mailed Jul. 17, 2009 for International Application No. PCT/EP2009/002749, 5 pgs.

English-Language Abstract for Japanese Patent Publication No. 02-195525 A, published Aug. 2, 1990; 1 page.

English-Language Abstract for Japanese Patent Publication No. 2007-002230 A, published Jan. 11, 2007; 1 page.

English-Language Abstract for Japanese Patent Publication No. 2007-189802 A, published Jul. 26, 2007; 1 page.

English-Language Abstract for Japanese Patent Publication No. 2007-304239 A, published Nov. 22, 2007; 1 page.

* cited by examiner

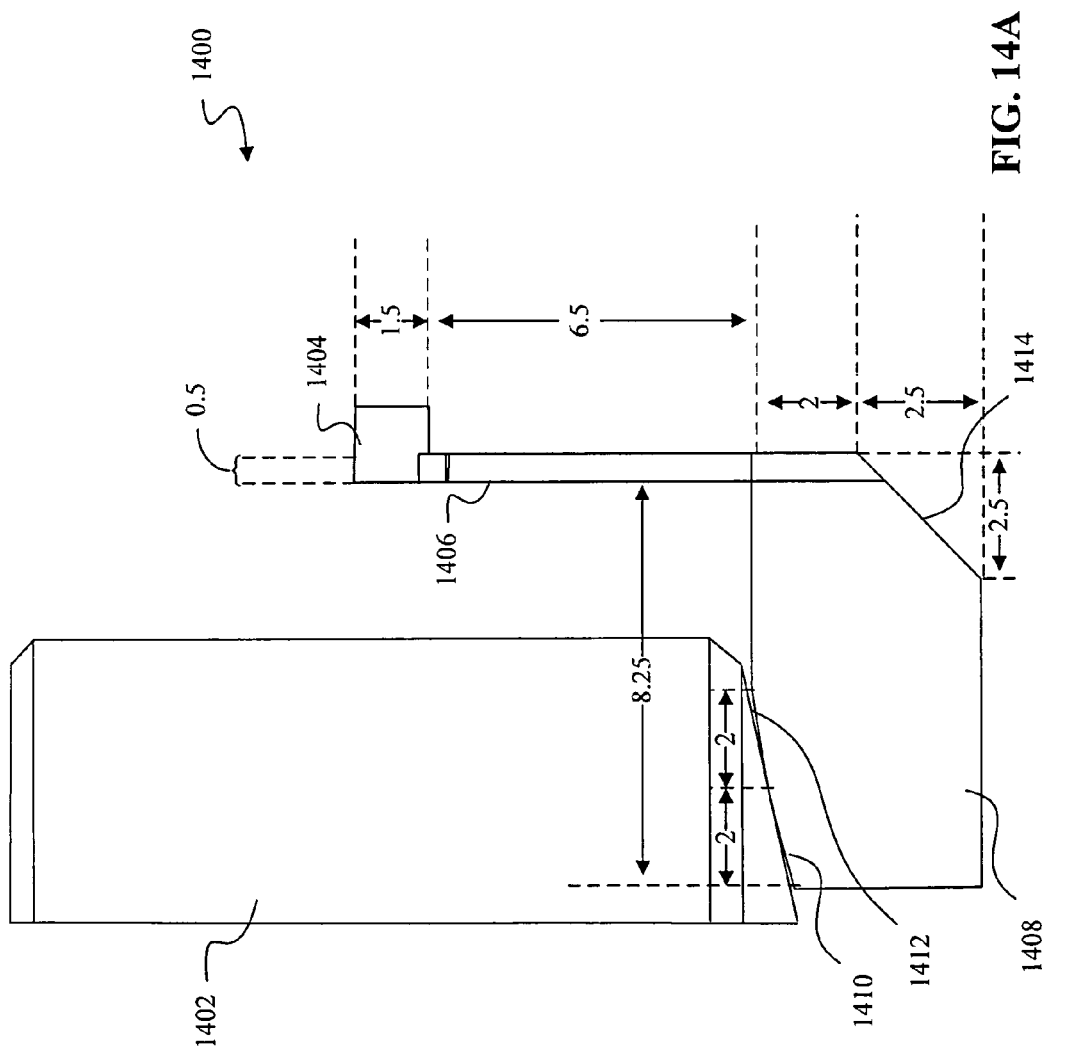

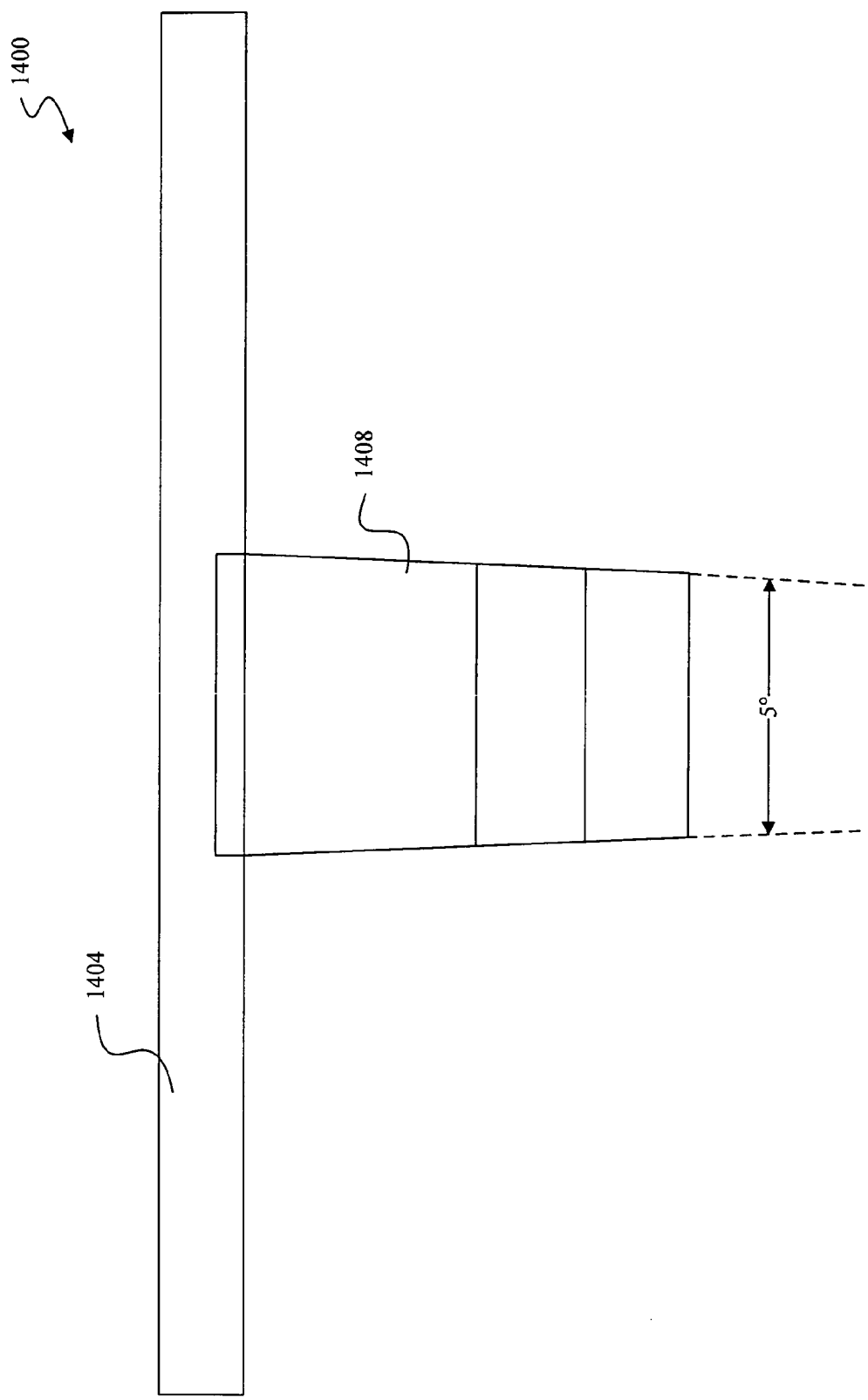

APPARATUS FOR SUPPORTING AN OPTICAL ELEMENT, AND METHOD OF MAKING SAME

BACKGROUND

1. Field of the Invention

The present invention relates to lithographic systems, and more particularly to supporting optical elements in lithographic systems.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which is commonly referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., photoresist) provided on the substrate.

Once the patterning device has patterned input illumination, the resulting illumination can be projected onto the substrate by one or more lenses. Displacements and/or deformations of the one or more lenses can cause errors in the patterned substrate. For example, vibrations or oscillations in an apparatus that supports the lenses can cause them to be displaced resulting in shifts or other errors in the pattern that is to be transferred onto the substrate. Furthermore, heat generated during the lithography process can lead to a deformation of the lenses causing a deformation of the pattern to be transferred onto the substrate.

SUMMARY

Therefore, what is desired is a support apparatus that substantially reduces deformations and displacements of the lens to prevent errors in a printed pattern.

In a first embodiment of the present invention, there is provided an apparatus for supporting an optical element that includes a lens cell and a plurality of fingers coupled to the lens cell. Each finger includes a base configured to be coupled to the optical element when mounted therein, first and second flexures coupled at first respective ends to and extending from the base at a divergence angle between about 75 and 165 degrees, a mounting member configured to couple together second respective ends of the first and second flexures. The mounting member thereby couples the base to the lens cell.

Another embodiment of the present invention provides a method of forming an apparatus for supporting an optical element that includes forming a lens cell and forming a plurality of fingers. Forming the plurality of fingers includes forming a base that is configured to be coupled to the optical element when mounted therein, forming first and second flexures coupled at first respective ends to and extending from the base at a divergence angle between about 75 and 165 degrees, and forming a mounting member configured to couple together second respective ends of the first and second flexures. The method further includes coupling the mounting member to the lens cell.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 14A-14C show an exemplary embodiment of a bipod finger with exemplary specifications, according to an embodiment of the present invention.

Figure 1:
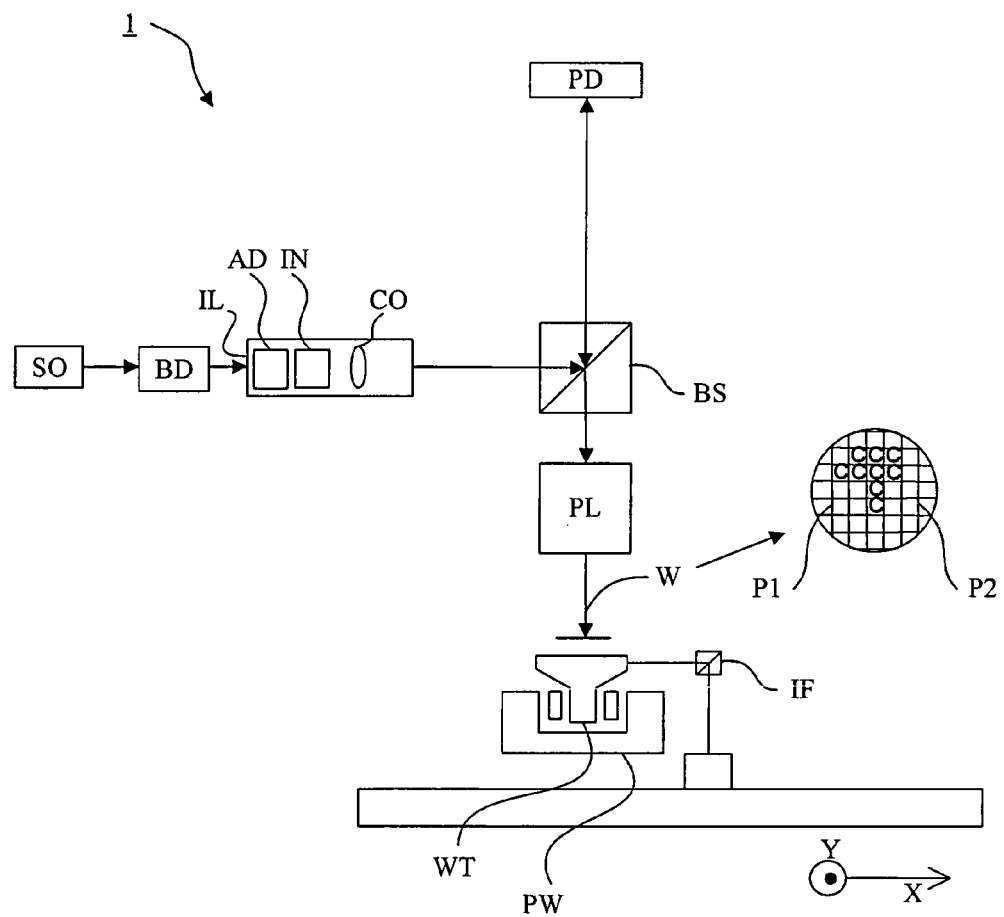
FIGS. 1 and 2 depict lithographic apparatus.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

FIG. 1 schematically depicts a lithographic apparatus 1. The apparatus comprises an illumination system IL, a patterning device PD, a substrate table WT, and a projection system PS. The illumination system (illuminator) IL is configured to condition a radiation beam B (e.g., UV radiation). The apparatus for supporting an optical element of the present invention can be employed in the lithographic apparatus of FIG. 1.

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device; however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Examples of such patterning devices include reticles, programmable mirror arrays, laser diode arrays, light emitting diode arrays, grating light valves, and LCD arrays.

The patterning device may comprise a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
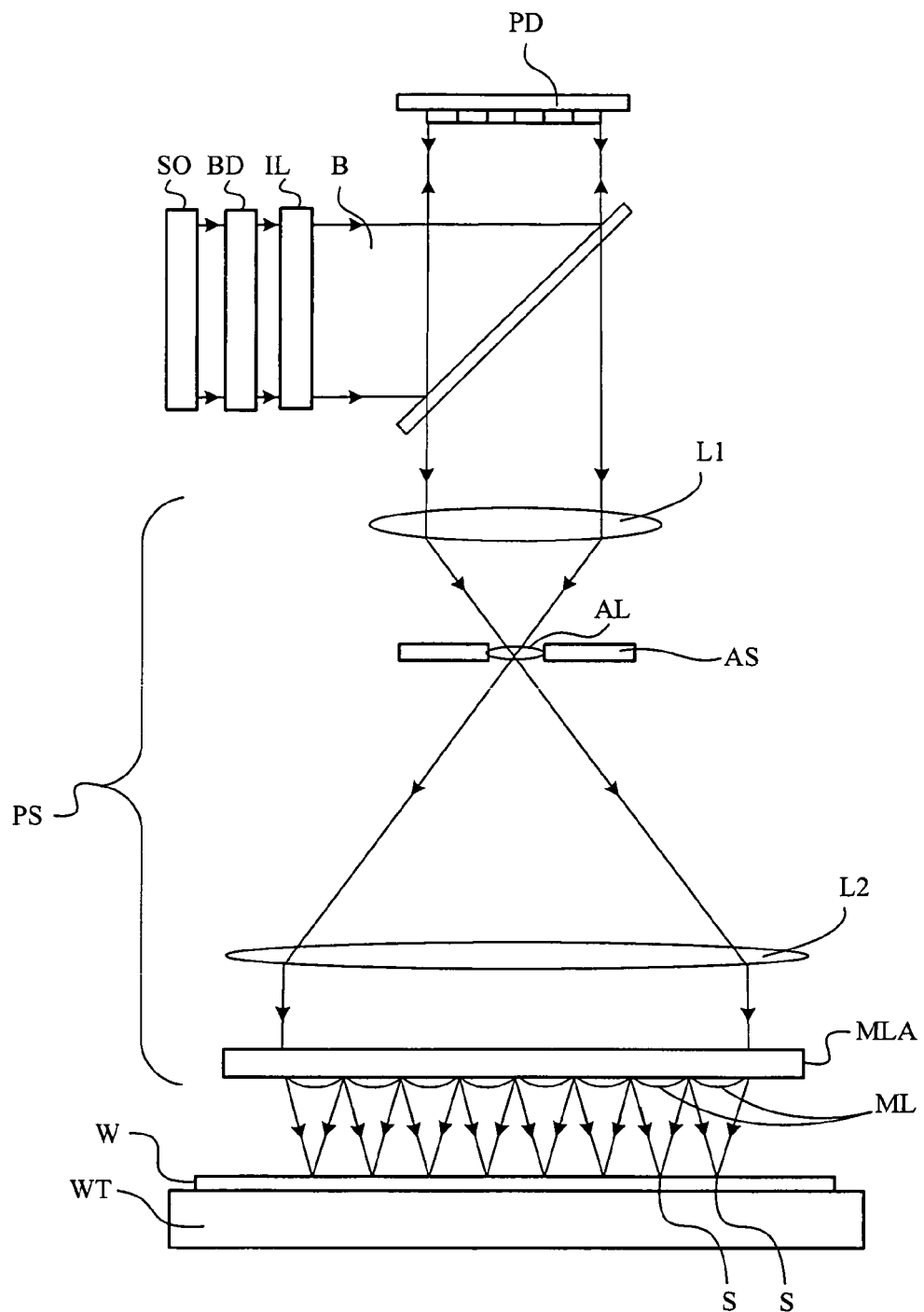

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
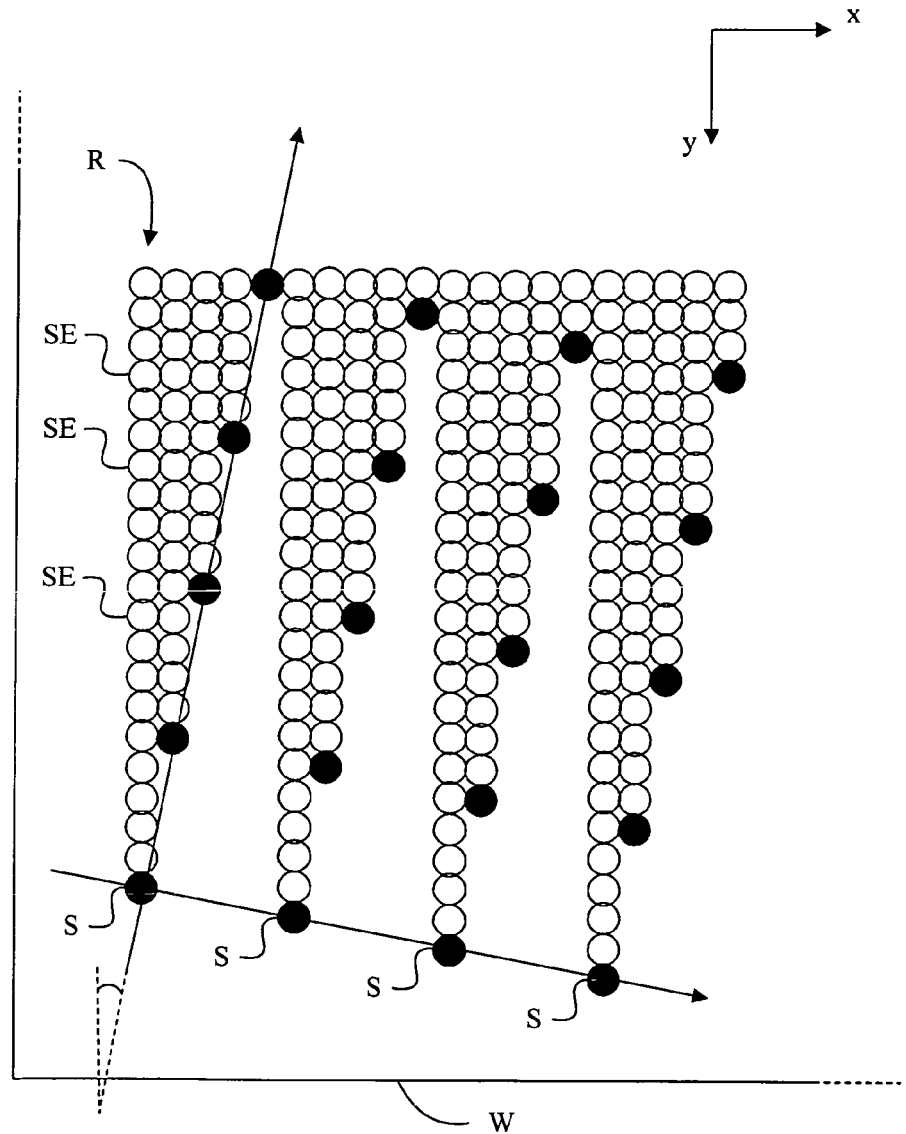
FIG. 3 depicts a mode of transferring a pattern to a substrate.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle θ can be at most 20°, at most 10°, at most 5°, at most 3°, at most 1°, at most 0.5°, at most 0.25°, at most 0.10°, at most 0.05°, or at most 0.01°. Alternatively, the angle θ is at least 0.001°.

Exemplary Optical Support Systems

Figure 4:
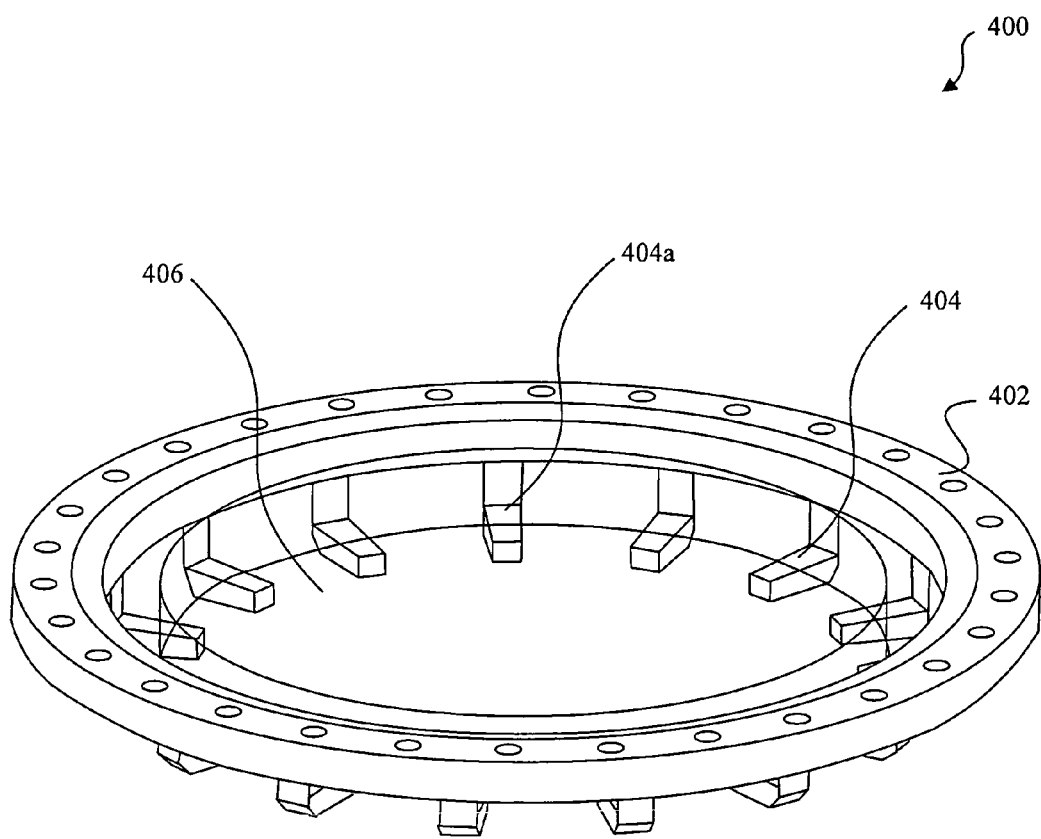
FIG. 4 shows an exemplary support apparatus.

FIG. 4 shows an exemplary support apparatus 400. Support apparatus 400 includes a lens cell 402 and fingers 404 including a finger 404*a*. Apparatus 400 is used to support a lens 406. In an embodiment, lens 406 and apparatus 400 can be included in a projection system similar to projection system PS described above.

Figure 5:
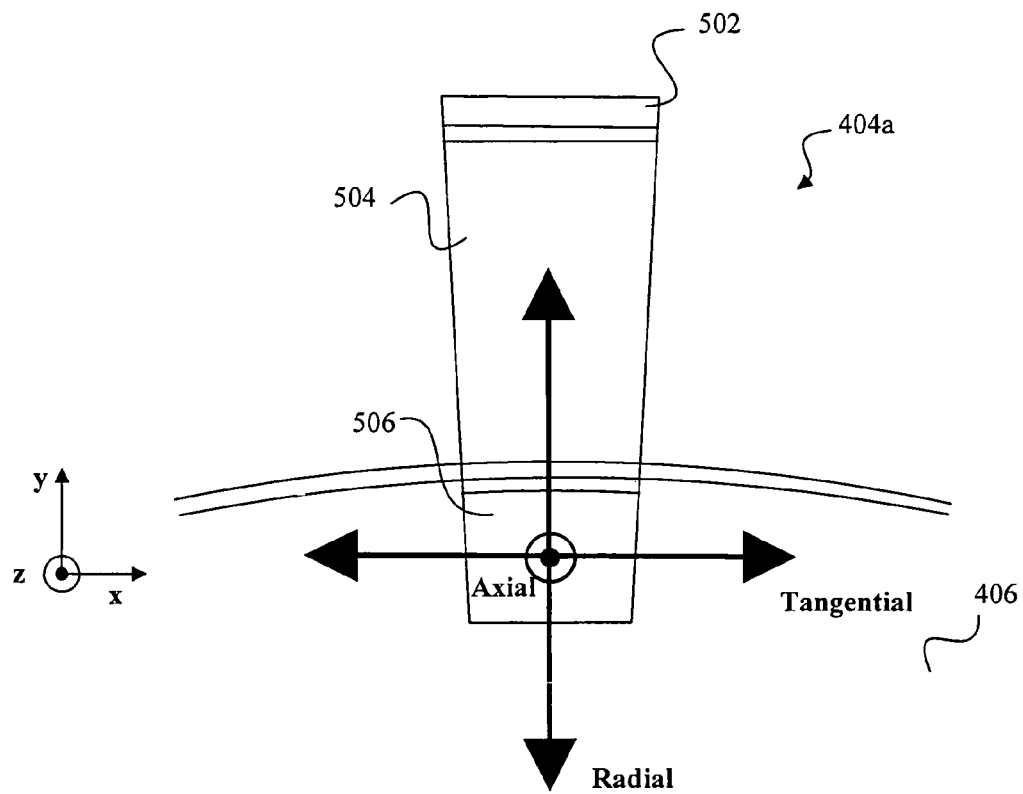
FIG. 5 shows a top view of an exemplary finger.

FIG. 5 shows a top view illustration of finger 404*a*. Finger 404*a* includes an attachment portion 502 and a base 504. Attachment portion 502 may be configured to couple finger 404*a* to lens cell 402. Base 504 includes a lens receiving portion 506 that is coupled to lens 406.

FIG. 5 also shows relevant directions used to describe various criteria herein. For example, lens 406 can be described with regard to an axial direction defined by the optical axis of lens 406, a radial direction that extends from the center optical axis of lens 406, and a tangential direction measured along the outer edge of lens 406. Furthermore, finger 404*a* can be described with reference to the X-Y plane and the Z direction. As would be apparent to those skilled in the relevant art(s), based on the description herein, the axial and Z directions coincide, and therefore will be used interchangeably herein.

Displacements or deformations of lens 406 can cause errors in a pattern formed on a substrate. Displacement of lens 406 may be compensated for by exposing the same target area on the substrate a multitude of times so that the resulting pattern is an average of the multiple exposures. If the displacement of lens 406 has a time average of zero, the multiple exposures may lead to the desired pattern being formed on the substrate. In alternate systems, however, a single exposure is used to form the desired pattern. Thus, even displacements of lens 406 that average to zero over time may lead to errors.

Lens 406 may be displaced in the X, Y, and/or Z directions due to vibrational, acoustic, thermal, or other energy, collectively referred to as excitation energy herein, that excites the interface between fingers 404 and lens 406. In an embodiment, stability requirements in the X and Y directions are more stringent than in the Z direction. For example, a support apparatus may be required to provide stability so that a root mean square (RMS) value of the displacement in the X and Y directions is less than 0.75 nm and an RMS value of the displacement in the Z direction is less than 80 nm.

Figure 6:
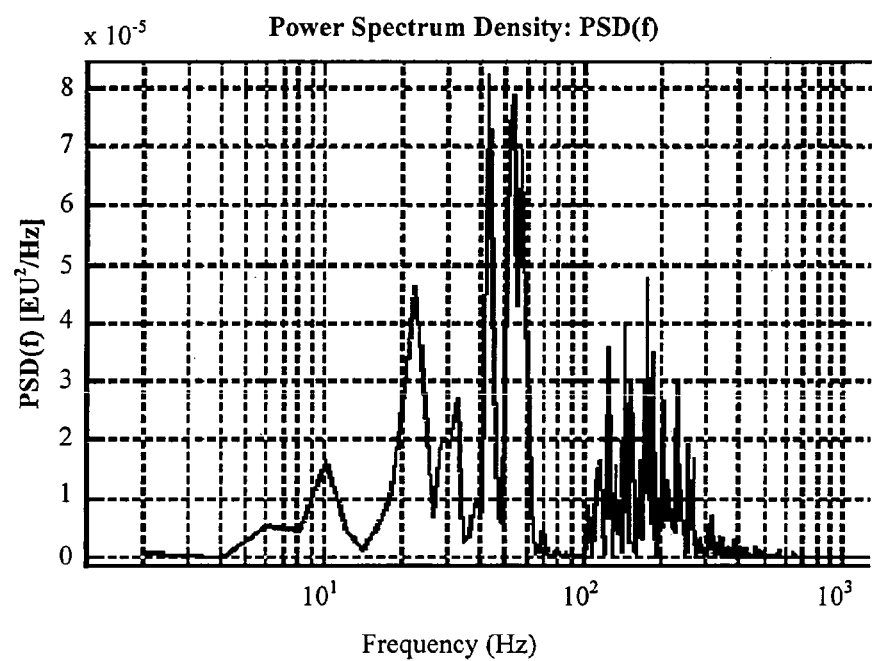
FIG. 6 shows a power spectral density of an exemplary excitation energy.

FIG. 6 shows a power spectral density (PSD) 600 of an exemplary excitation energy. As shown in FIG. 6, the excitation energy present at each frequency generally falls as frequency increases. In particular, the energy tends to roll off or substantially decrease as the frequency approaches 1000 Hz ($10^3$ Hz).

Fingers 404 may have one or more resonant frequency modes. Almost all of the excitation energy at a resonant frequency mode of fingers 404 can cause oscillations in fingers 404. These oscillations are often only limited by an intrinsic damping of fingers 404. Since fingers 404 are typically formed out of materials that have low intrinsic damping, e.g., a metal such as stainless steel, oscillations due to the excitation energy at a resonant frequency mode can become significant.

In an embodiment, the first resonant mode of fingers 404 in the X-Y plane ranges between about 400 Hz to 800 Hz, e.g., 798 Hz. As shown in FIG. 6, the excitation energy may include significant energy in such a frequency range. Thus, fingers 404 may be substantially excited in the X-Y plane resulting in significant oscillations of fingers 404 in the X-Y plane. Fingers 404 may have a first resonant mode in the Z direction of over 1000 Hz, so that they may not be substantially excited by the excitation energy in the Z direction. However, as described above, the stability requirements in the X and Y directions can be more stringent than in the Z direction, so that the substantial oscillations in the X-Y plane can cause significant degradation in the performance of a lithographic system.

Figure 7:
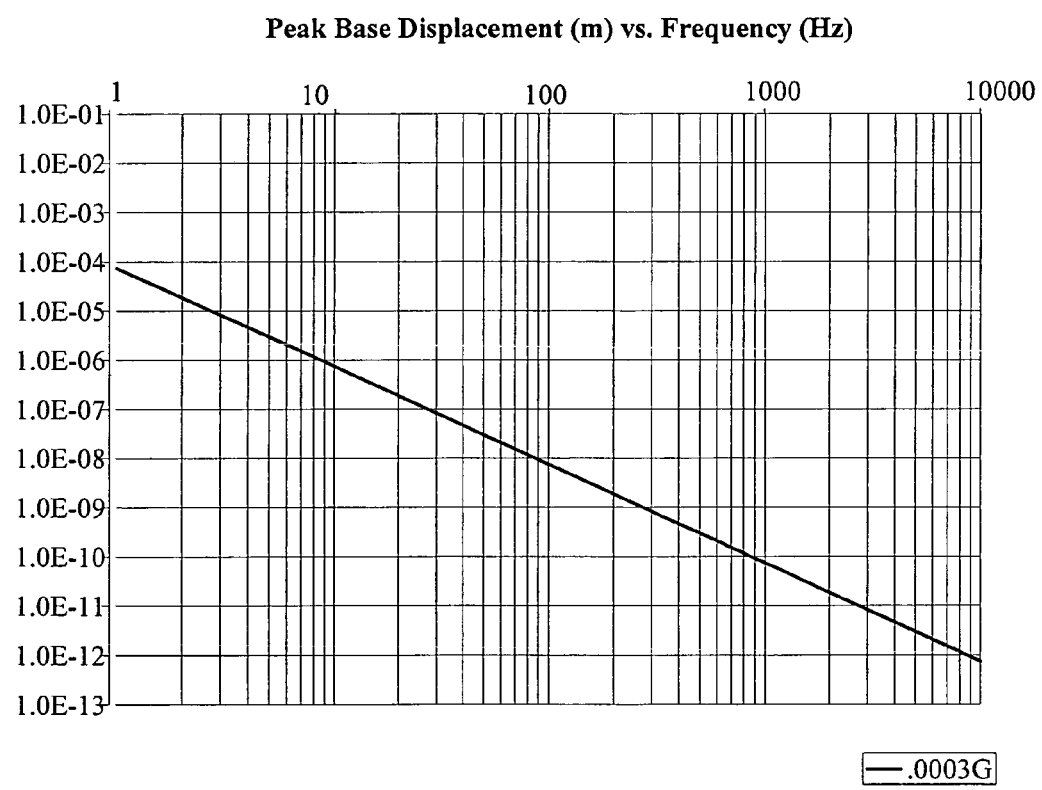
FIG. 7 shows a plot of a peak displacement of an exemplary finger due to a given base acceleration, as a function of frequency.

FIG. 7 shows a plot 700 of a peak displacement of an exemplary finger, in meters (m), as a function of the frequency when the acceleration at each frequency is held constant. As shown in FIG. 7, the peak displacement falls as the frequency increases. Taking both FIGS. 6 and 7 into consideration, as the frequency of the first resonant mode increases, the displacement of fingers 404 due to excitation energy decreases because the component of the total energy at that frequency decreases, as shown in FIG. 6, and the maximum possible displacement that the energy can cause also decreases, as shown in FIG. 7. Thus, the inventors have discovered that by increasing the frequency of the first X-Y resonant mode of fingers 404 beyond 1000 Hz, displacement in the X and Y directions can be substantially decreased.

Deformation of lens 406, e.g., due to heat generated within the lithographic system, also can lead to performance degradation. Since the metal used to form fingers 404 can expand faster as a function of temperature than does lens 406, fingers 404 tend to pull on lens 406 as temperature increases. In particular, fingers 404 tend to exert force on lens 406 in the radial direction of lens 406. For example, each finger of fingers 404 may exert about a 2.07N force on lens 406 at an operating temperature of about 50° C. Fingers that are compliant in the radial direction over a range of operating temperatures may exert less force on a lens, and thus reduce the deformation of the lens.

Due to variations in the manufacturing and mounting of the fingers 404, all of the fingers of fingers 404 may not be aligned at the same height. This unevenness may result in fingers of fingers 404 having varying contact with lens 406. To ensure that each finger of fingers 404 contacts lens 406 as evenly as possible, fingers 404 may be configured to have unbonded Z compliance. For example, fingers 404 can be able to be displaced up to about 30 µm in the Z direction. In an embodiment, the manufacturing and mounting of the fingers 404 can be accomplished with stringent enough tolerances such that 30 µm compliance in the Z direction is sufficient to ensure that the plurality of fingers 404 support lens 406 substantially evenly.

Thus, fingers 404 can be described with respect to their: (1) radial compliance over a range of operating temperatures, e.g., their ability to prevent thermal induced deformations of a lens, (2) first X-Y and Z resonant modes, e.g., their ability to prevent displacements of the lens, and (3) unbonded Z compliance, e.g., their ability to compensate for manufacturing tolerances. The criteria described above are a function of the material used to form and the geometry of fingers 404.

Other Optical Support Systems

Figures 8A, 8B:
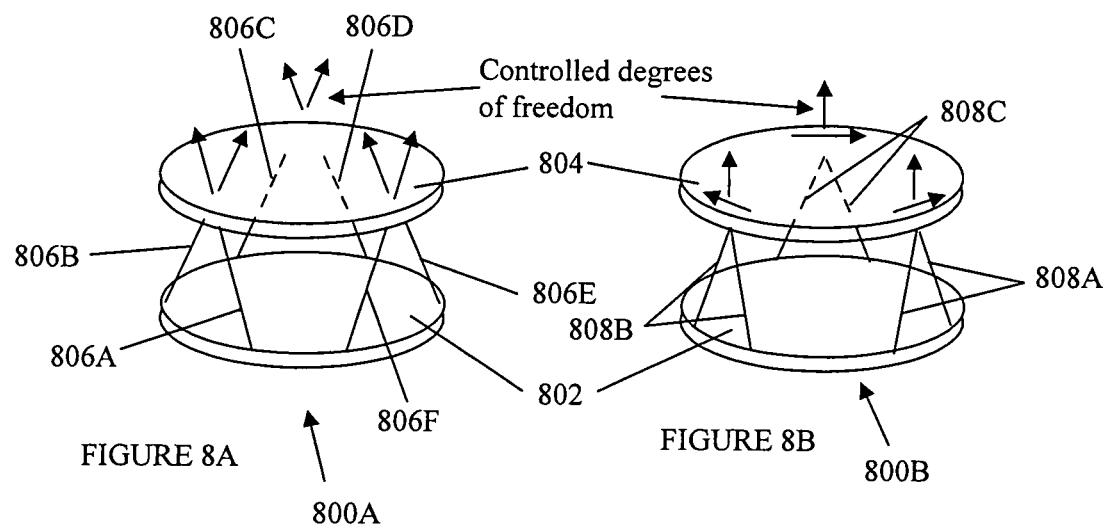
FIGS. 8A and 8B show three dimension schematic views of an exemplary kinematic support.

FIGS. 8A and 8B show three dimensional schematic views of kinematic supports 800A and 800B, respectively. Kinematic supports 800A and 800B can be used to constrain an optical element, e.g., a lens, mirror, etc., in all six degrees of freedom. Kinematic support 800A includes a base assembly 802, a payload assembly 804 and six monopod connecting elements 806A-806F. Kinematic support 800B includes base assembly 802, payload assembly 804, and bipod connecting elements 808A-808C. Payload assembly 804 holds or aligns the optical element. For more information regarding kinematic supports, please refer to U.S. Pat. No. 6,674,585 to Calvert et al., incorporated by reference herein in its entirety.

Figure 9:
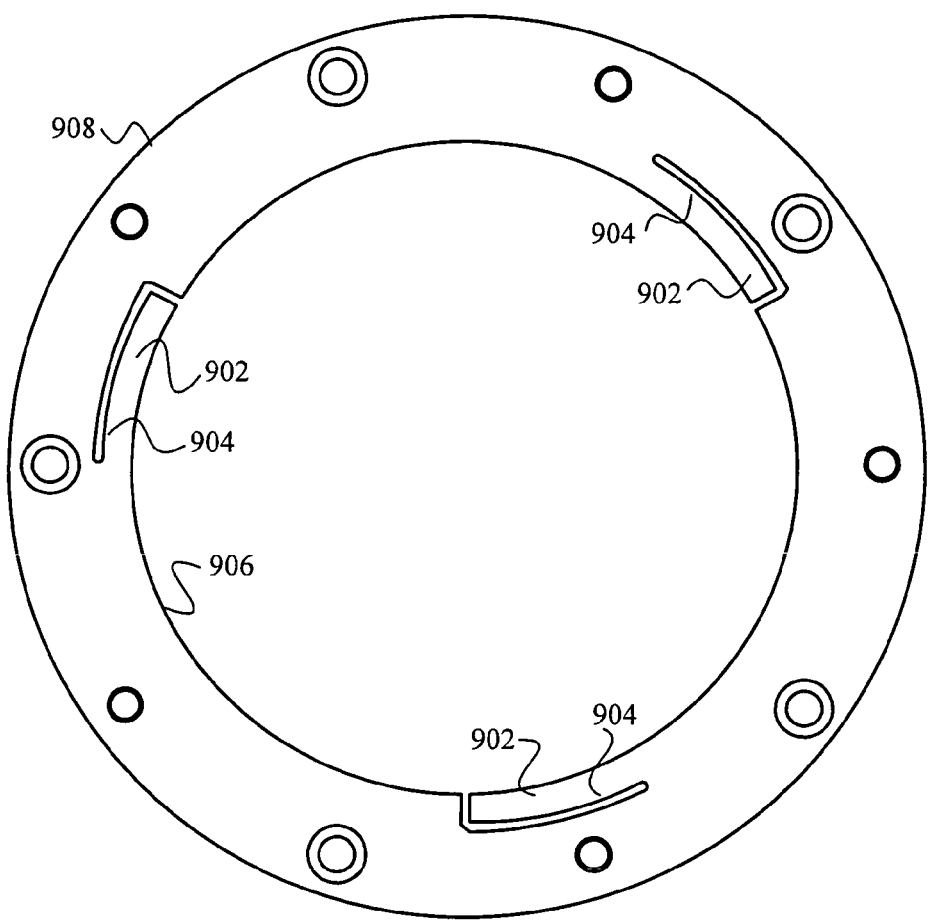
FIG. 9 shows a schematic plan view of a tangent blade lens cell.

FIG. 9 shows a schematic plan view of a tangent blade lens cell 900. Lens cell 900 includes fingers 902 formed by slots 904 cut into an inner perimeter 906 of an annulus 908. A lens (not shown) can be seated on top of fingers 902. Fingers 902 can twist and move radially so as to absorb deformation of annulus 908. For more information regarding tangent blade lens cell 900, please refer to U.S. Pat. No. 5,428,482 to Bruning et al., incorporated by reference herein in its entirety.

The support apparatuses shown in FIGS. 8 and 9 may also suffer from displacements and/or deformations of the supported lens and/or the inability to evenly support the lens.

Bipod Finger Embodiments

In embodiments described herein, an apparatus for supporting a lens is provided that prevents deformation and displacement of the lens and provides sufficient compliance to ensure that the lens is supported substantially evenly.

Figure 10:
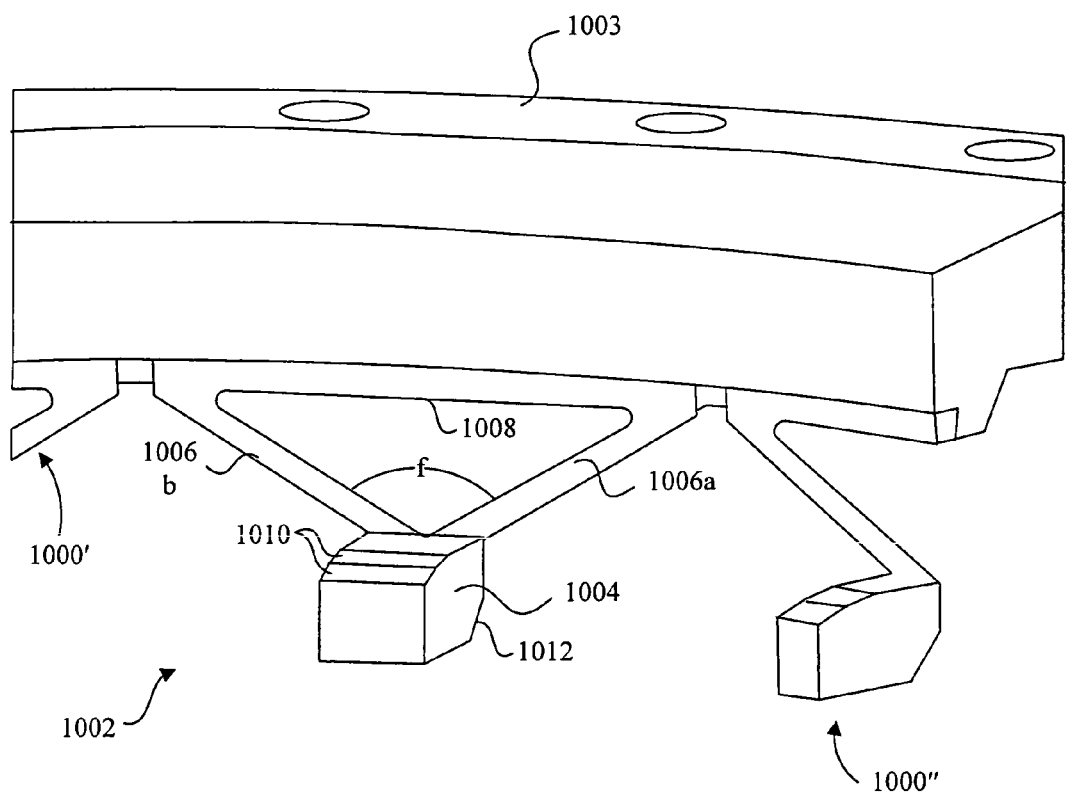
FIG. 10 shows a partial view of an apparatus for supporting a lens, according to embodiment of the present invention.

FIG. 10 shows a partial view of an apparatus 1000 for supporting a lens, according to an embodiment of the present invention. Apparatus 1000 includes a complete bipod finger 1002, neighboring partial bipod fingers 1000' and 1000", and a lens cell 1003. In an embodiment, lens cell 1003 is substantially similar to lens cell 402, described with reference to FIG. 4.

Bipod finger 1002 includes a base 1004, first and second flexures 1006a and 1006b, and a mounting member 1008. Base 1004 optionally includes recessed pads 1010 and a chamfer 1012. Recessed pads 1010 may be configured to accommodate bonding material. In particular, recessed pads 1010 may provide space for a bonding material, e.g., an epoxy, which bonds the lens to base 1004. Chamfer 1012 is an optional removal of excess material. As shown in FIG. 10, chamfer 1012 removes unneeded material from a portion of base 1004 making base 1004 lighter. In an embodiment, the mass of bipod finger 1002 is approximately 0.427 kg.

As shown in FIG. 10, base 1004 is coupled to first and second flexures 1006a and 1006b. In an embodiment, first and second flexures 1006a and 1006b can be integral with base 1004. Alternatively, first and second flexures 1006a and 1006b can be formed separate from base 1004 and physically coupled to base 1004 when bipod finger 1002 is formed. First and second flexures 1006a and 1006b extend from base 1004 at a divergence angle, cp. In an embodiment, φ can range from about 75 degrees to about 165 degrees. For example, φ can be about 120 degrees.

Respective ends of first and second flexures 1006a and 1006b are coupled to a mounting member 1008. Mounting member 1008 can be used to couple bipod finger 1002 to lens cell 1003. For example, mounting member 1008 can be brazed to lens 1003. Mounting member 1008 can be integral with first and second flexures 1006a and 1006b. Alternatively, mounting member 1008 can be formed separately and coupled to first and second flexures 1006a and 1006b when bipod finger 1002 is formed.

Alternatively, bipod finger 1002 may not include mounting member 1008. In such an embodiment, first and second flexures 1006a and 1006b can be coupled directly to lens cell 1003. For example, flexures 1006a and 1006b can be brazed directly to lens cell 1003.

In an embodiment, lens cell 1003 and/or bipod finger 1002 can be formed out of a metallic material. For example, lens cell 1003 and/or bipod finger 1002 can be formed of stainless steel, e.g., 15-5 stainless steel.

The geometry of bipod finger 1002 can result in support apparatus 1000 having certain advantageous properties. For example, bipod finger 1002 can have an increased radial compliance as the operating temperature increases. For example, a radial force exerted by bipod finger 1002 on a lens may be 0.427N at 50° C., compared to 2.07N for the conventional fingers shown in FIG. 4. Furthermore, bipod finger 1002 has a first resonant X-Y mode higher than 1000 Hz. For example, the first X-Y resonant mode for bipod finger 1002 is about 1325 Hz, compared to 798 Hz for the conventional fingers shown in FIG. 4.

In addition to advantageous radial compliance and X-Y resonant properties, bipod finger 1002 can also retain and/or improve on the advantageous properties of the conventional fingers shown in FIG. 4. For example, bipod finger 1002 can have an unbonded compliance of about 30 μm, the same as a conventional finger, to accommodate a lens surface that is uneven. Furthermore, bipod finger 1002 can also have a first Z resonant mode higher than 1000 Hz. For example, bipod finger 1002 has a first Z resonant mode of 1567 Hz, compared to 1269 Hz for the conventional fingers shown in FIG. 4.

Thus, the geometry of bipod finger 1002 results in it having increased radial compliance over a range of operating temperatures, first resonant X-Y and Z modes over 1000 Hz, and a sufficient unbonded compliance to manufacturing tolerances.

Figure 11:
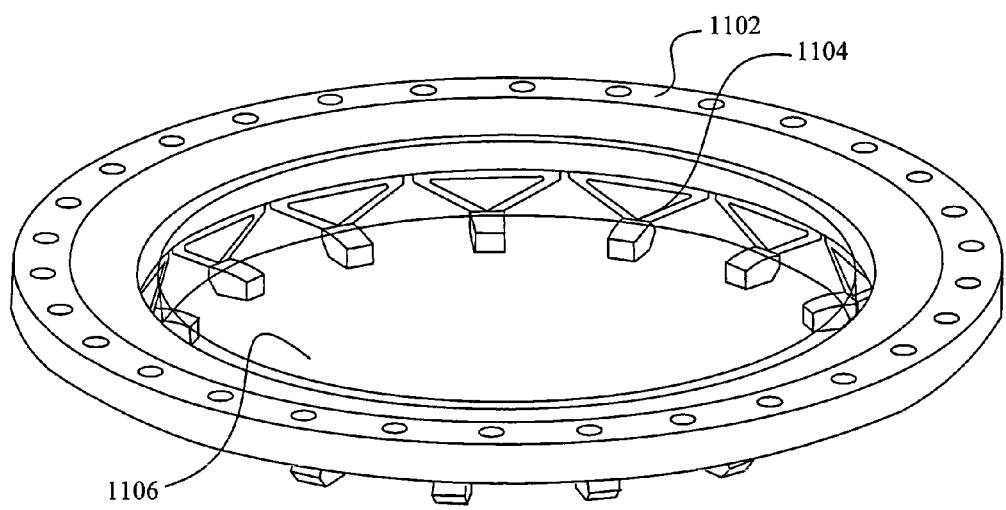
FIG. 11 shows an apparatus for supporting a lens, according to embodiment of the present invention.

FIG. 11 shows an apparatus 1100 for supporting a lens 1106, according to an embodiment of the present invention. Apparatus 1100 includes a lens cell 1102 and bipod fingers 1104. Lens cell 1102 and bipod fingers 1104 can be substantially similar to lens cell 1003 and bipod finger 1002, respectively, described with reference to FIG. 10.

In an embodiment, apparatus 1100 can be a redundant structure that substantially constrains the movement of lens 1106. In such an embodiment, plurality of fingers 1104 may include at least 7 bipod fingers. For example, plurality of fingers 1104 may include between about 7 and about 32 bipod fingers. By including at least 7 bipod fingers, the displacement of lens 1106 in the X-Y plane and the Z direction is substantially constrained.

Exemplary Method Embodiments

Figure 12:
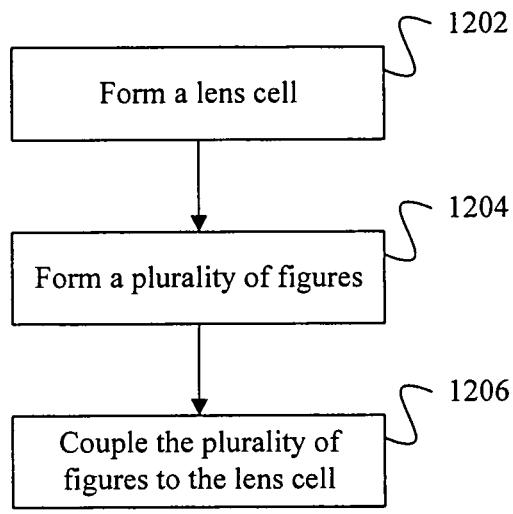
FIG. 12 shows a flowchart depicting a method, according to an embodiment of the present invention.

FIG. 12 shows a flowchart 1200 providing example blocks for forming an apparatus for supporting a lens. Other structural and operational embodiments will be apparent to persons skilled in the relevant art(s) based on the following discussion. The blocks shown in FIG. 12 do not necessarily have to occur in the order shown. The blocks of FIG. 12 are described in detail below.

In block 1202, a lens cell is formed. For example, lens cell 1202 can be formed out of stainless steel according to methods known to those skilled in the relevant art(s).

Figure 13:
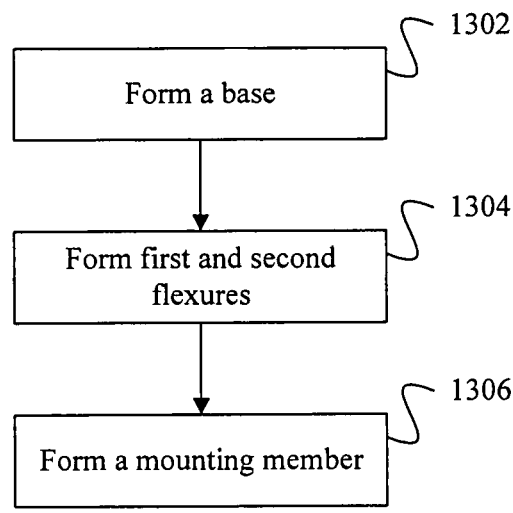
FIG. 13 shows example steps that may be performed during the flowchart of FIG. 12, according to an embodiment of the present invention.

In block 1204, a plurality of fingers is formed. In an embodiment, block 1204 may be performed by blocks 1302-1306 shown in FIG. 13.

In block 1302, a base configured to be coupled to a lens when mounted to the apparatus is formed. In an embodiment, block 1302 may further include forming recessed configured to accommodate a bonding material.

In block 1304, first and second flexures are formed. For example, first and second flexures 1006a and 1006b can be formed out of stainless steel. In an embodiment, aspects of the first and second flexures may be formed through wire electrical discharge machining (EDM). As would be appreciated by those skilled in the relevant art(s), based on the description herein, wire EDM is a process in which an electrode held at a potential is inserted into an electrically conductive material. Sparks between the electrode and the electrically conductive material form a crater in the electrically conductive material. Such a process can be used to form fine features of the first and second flexures.

In another embodiment, forming the first and second flexures may include forming the first and second flexures such that a divergence angle between them is between about 75 degrees and 165 degrees. In a further embodiment, the divergence angle can be about 120 degrees.

In block 1306, a mounting member is formed. The mounting member, base, and first and second flexures or any subcombination thereof may be components of an integral bipod finger. Alternatively, the mounting member, base, and first and second flexures can be formed separately and coupled together to form a bipod finger.

As described above, the formed fingers may have a first X-Y resonant mode between the base and the lens at a frequency higher than 1000 Hz and be radially compliant over a range of operating temperatures.

Returning to FIG. 12, in another embodiment, block 1204 can include forming at least 7 fingers.

In block 1206, each finger of the plurality of fingers is coupled to the lens cell. For example, the plurality of fingers can be coupled to the lens cell by brazing their respective mounting members to the lens cell.

In an alternate embodiment, the fingers can be formed as integral components of the lens cell. For example, the lens cell and the fingers can be made out of the same piece of metal. Thus, in such an embodiment, block 1206 would not need to be completed.

The support apparatuses described above have been described with reference to the embodiments in which they support a lens. However, as would be appreciated by those skilled in the relevant art(s), based on the description herein, the support apparatuses described above can also be used to support other types of optical elements, e.g., mirrors.

Exemplary Bipod Finger Embodiment

Figure 14B:
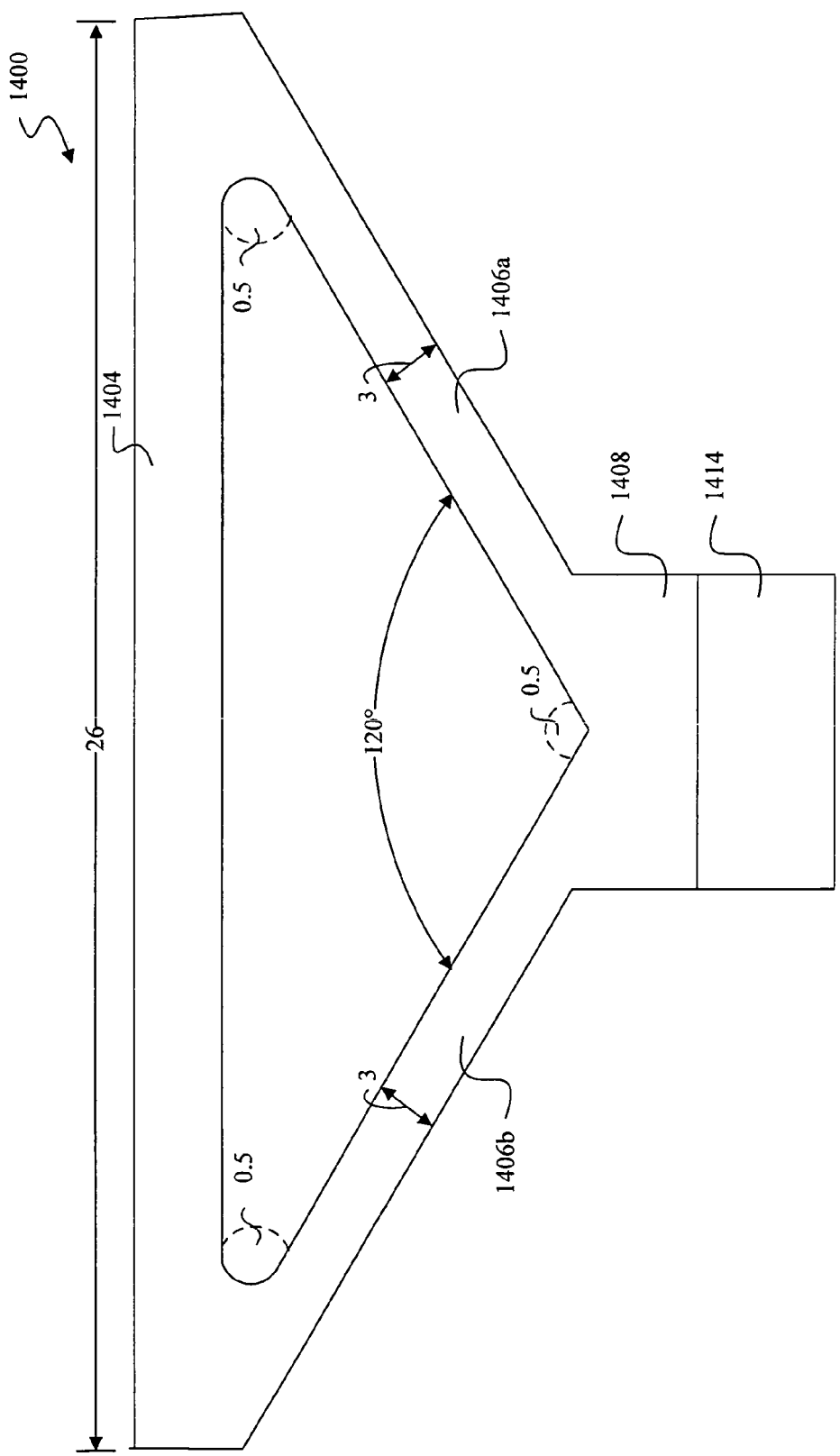

FIGS. 14A-14C show an exemplary embodiment of a bipod finger with exemplary specifications in millimeters (mm), according to an embodiment of the present invention. FIG. 14A shows a side view of a bipod finger 1400 coupled to a lens 1402. In an embodiment, lens 1402 has a diameter of 124 mm. Bipod finger 1400 includes a mounting piece 1404, flexures 1406, and a base 1408. As shown in FIG. 14A, mounting piece 1404 has a height of about 1.5 mm. Flexures 1406 have a vertical height of about 6.5 mm and a thickness of about 0.5 mm. Base 1408 includes recessed pads 1410 and 1412 and a chamfer 1414. Base 1408 has a total thickness of about 8.25 mm and a total vertical height of about 4.5 mm. Pads 1410 and 1412 each have a length of about 2 mm. Chamfer 1414 has a height and length of about 2.5 mm.

FIG. 14B shows a back view of bipod finger 1400. As shown in FIG. 14B, mounting piece 1404 has a width of about 26 mm. Flexures 1406a and 1406b each have a width of about 3 mm and extend from base 1408 at a divergence angle of about 120 degrees. Areas in which flexures 1406a and 1406b join with mounting piece 1404 and base 1408 have a radius of curvature of about 0.5 mm.

FIG. 14C shows a top view of bipod finger 1400. As shown in FIG. 14C, base 1408 sweeps an angle of about 5 degrees measured from the center of lens 1402 (not shown in FIG. 14C) that is supported by bipod finger 1400. In an embodiment, bipod finger 1400 is made out of 15-5 stainless steel.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. An apparatus for supporting an optical element, comprising:
   a lens cell having an interior surface, wherein the interior surface circumscribes an interior region of the lens cell; and
   a plurality of fingers attached to the lens cell, wherein each of the plurality of fingers includes:
      a base configured to directly contact the optical element.
      first and second flexures coupled at first respective ends to the base and extending from the base at a divergence angle between about 75 and 165 degrees, wherein the base extends from an outer surface of the first and second flexures into the interior region of the lens cell, and
      a mounting member that attaches a second end of the first flexure to a second end of the second flexure and attaches the base to the lens cell,
   wherein each mounting member is separated from all other mounting members of the plurality of fingers.

2. The apparatus of claim 1, wherein each finger of the plurality of fingers is compliant in a radial direction with respect to the optical element over a range of operating temperatures.

3. The apparatus of claim 1, wherein:
   the optical element is a lens; and
   a first finger of the plurality of fingers is configured such that a first X-Y resonant mode between the base of the first finger and the optical element is at a frequency higher than about 1000 Hz.

4. The apparatus of claim 1, wherein the plurality of fingers includes at least 7 fingers.

5. The apparatus of claim 1, wherein the divergence angle of each finger of the plurality of fingers is about 120 degrees.

6. The apparatus of claim 1, wherein the base of each finger of the plurality of fingers includes recessed pads configured to accommodate a bonding material.

7. The apparatus of claim 1, wherein each finger of the plurality of fingers comprises a metal or stainless steel.

8. The apparatus of claim 1, wherein the first and second flexures of each finger of the plurality of fingers are integrated with the base and the mounting member of a respective finger of the plurality of fingers.

9. The apparatus of claim 1, wherein the mounting member of a first finger of the plurality of fingers has a surface that is attached to the interior surface of the lens cell and a base of the first finger has a surface that is configured to directly contact the optical element and wherein the surface of the mounting member of the first finger is perpendicular to the surface of the base of the first finger.

10. A method of forming an apparatus for supporting an optical element, comprising:
   forming a lens cell having an interior surface, wherein the interior surface circumscribes an interior region of the lens cell;
   forming a plurality of fingers, comprising:
      forming a base configured to directly contact the optical element,
      forming first and second flexures coupled at first respective ends to the base and extending from the base at a divergence angle between about 75 and 165 degrees, wherein the base extends from an outer surface of the first and second flexures into the interior region of the lens cell, and
      forming a mounting member that attaches a second end of the first flexure to a second end of the second flexure; and
   attaching each of the mounting members of each finger of the plurality of fingers to the lens cell,
   wherein each mounting member is separated from all other mounting members of the plurality of fingers.

11. The method of claim 10, wherein the forming the first and second flexures comprises:
   forming the first and second flexures coupled to the first respective ends to the base and extending from the base at the divergence angle of about 120 degrees.

12. The method of claim 10, wherein the attaching the mounting member of each finger of the plurality of fingers to the lens cell comprises brazing a mounting member of each finger of the plurality of fingers to the lens cell.

13. The method of claim 10, wherein the forming the plurality of fingers comprises:
   forming the plurality of fingers such that each finger of the plurality of fingers is compliant in a radial direction of the optical element over a range of operating temperatures.

14. The method of claim 10, wherein the optical element is a lens and forming the plurality of fingers comprises:

forming the plurality of fingers such that a first finger of the plurality of fingers has a first X-Y resonant mode between the base of the first finger and the optical element at a frequency higher than about 1000 Hz.

15. The method of claim 10, wherein the forming the plurality of fingers comprises:

forming at least 7 fingers.

16. The method of claim 10, wherein the forming the plurality of fingers comprises:

removing material using a wire electrical discharge machining process.

17. The method of claim 10, wherein the forming the plurality of fingers comprises:

forming a recessed pad accommodating a bonding material.

18. A lithographic apparatus for projecting an image onto a substrate, the lithographic apparatus comprising:

an optical system, the optical system including:

a lens cell having an interior surface, wherein the interior surface circumscribes an interior region of the lens cell; and a plurality of fingers attached to the lens cell, wherein each of the plurality of fingers includes:

a base configured to directly contact an optical element, first and second flexures coupled at first respective ends to the base and extending from the base at a divergence angle between about 75 and 165 degrees, wherein the base extends from an outer surface of the first and second flexures into the interior region of the lens cell, and a mounting member that attaches together second respective ends of the first and second flexures and attaches the base to the lens cell, wherein each mounting member is separated from all other mounting members of the plurality of fingers.

19. The lithographic apparatus according to claim 18, wherein the optical system is a projection optical system configured to project the image onto the substrate.

20. The lithographic apparatus according to claim 18, wherein the optical system is an illumination system arranged to condition and direct a radiation beam onto a patterning device.

* * * * *

UNITED STATES PATENT AND TRADEMARK OFFICE
CERTIFICATE OF CORRECTION

PATENT NO. : 8,947,634 B2  Page 1 of 1
APPLICATION NO. : 12/933506
DATED : February 3, 2015
INVENTOR(S) : Farnsworth et al.

It is certified that error appears in the above-identified patent and that said Letters Patent is hereby corrected as shown below:

In the claims

In column 15, line 56, claim 1, please delete "." and insert --;--.
In column 16, line 11, claim 3, please delete "1000 Hz" and insert --1000Hz--.
In column 17, line 6, claim 14, please delete "1000 Hz" and insert --1000Hz--.

Signed and Sealed this
Twenty-seventh Day of October, 2015

Michelle K. Lee
*Director of the United States Patent and Trademark Office*